(12) United States Patent
Nishimoto et al.

(10) Patent No.: US 7,738,255 B2
(45) Date of Patent: Jun. 15, 2010

(54) ELECTRONIC MODULE AND ELECTRONIC DEVICE

(75) Inventors: Masahiko Nishimoto, Kanagawa (JP); Masato Kobayashi, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 12/261,592

(22) Filed: Oct. 30, 2008

(65) Prior Publication Data

US 2009/0122496 A1 May 14, 2009

(30) Foreign Application Priority Data

Nov. 8, 2007 (JP) .............................. P2007-290368

(51) Int. Cl.
*H05K 7/00* (2006.01)
(52) U.S. Cl. .................... 361/729; 361/752; 361/800
(58) Field of Classification Search ......... 361/728–729, 361/748, 752, 790, 797, 800–802, 816, 818; 439/368, 946; 174/250, 255, 68.1
See application file for complete search history.

(56) References Cited

U.S. PATENT DOCUMENTS

| | | | |
|---|---|---|---|
| 4,821,145 A | 4/1989 | Corfits et al. | |
| 4,821,146 A | 4/1989 | Behrens et al. | |
| 4,931,907 A | 6/1990 | Robinson et al. | |
| 5,791,753 A * | 8/1998 | Paquin ................. | 312/332.1 |
| 6,222,736 B1 * | 4/2001 | Sim et al. ................ | 361/727 |
| 6,374,460 B1 * | 4/2002 | Edevold et al. ............. | 16/422 |
| 6,560,114 B2 * | 5/2003 | Berry et al. ................ | 361/727 |
| 6,992,900 B1 | 1/2006 | Suzue et al. | |
| 7,354,293 B2 * | 4/2008 | Liang .................... | 439/372 |

FOREIGN PATENT DOCUMENTS

| | | |
|---|---|---|
| GB | 2 118 786 | 11/1983 |
| JP | 01-143397 | 6/1989 |
| JP | 01-168099 | 7/1989 |
| JP | 03-040386 | 2/1991 |
| JP | 05-243763 | 9/1993 |
| JP | 06-060944 | 3/1994 |
| JP | 08-162782 | 6/1996 |
| JP | 08-264976 | 10/1996 |
| JP | 2003-059255 | 2/2003 |
| JP | 2006-060190 | 3/2006 |
| WO | WO 90/08407 | 7/1990 |

* cited by examiner

*Primary Examiner*—Hung S Bui
(74) *Attorney, Agent, or Firm*—Morgan, Lewis & Bockius LLP

(57) ABSTRACT

An electronic module includes a board unit having a handle and a module housing. The handle includes a grip portion and a pair of leg portions. The leg portions have engagement convex portions extending from portions serving as rotary pivots, of the leg portions. The module housing includes an engagement concave portion provided to correspond to the engagement convex portions. When the board unit is inserted into the module housing, by rotating the handle around the rotary pivots in a direction along which the grip portion approaches the panel portion, the engagement convex portions are brought into contact with a part of the engagement concave portion to produce a force in a direction, along which the board unit is pressed into the module housing.

12 Claims, 17 Drawing Sheets

FIG. 6A
FIG. 6B
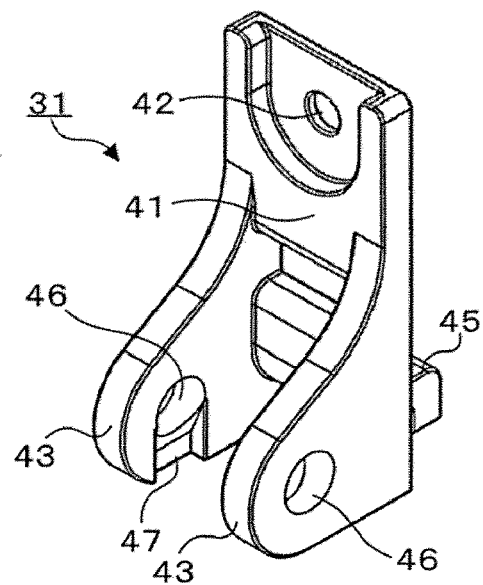
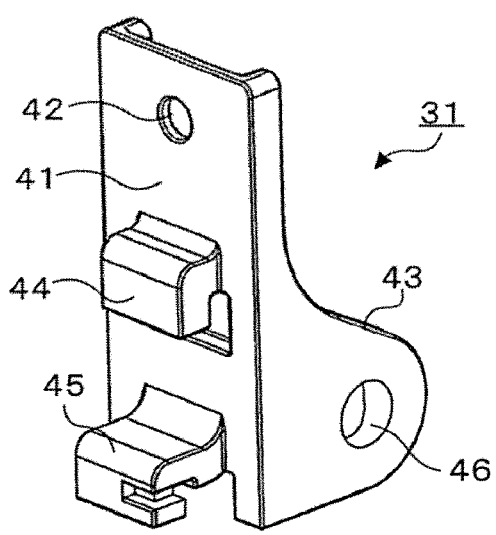

ELECTRONIC MODULE AND ELECTRONIC DEVICE

CROSS-REFERENCE TO RELATED APPLICATIONS

This application is based on and claims priority under 35 USC 119 from Japanese Patent Application No. 2007-290368 filed Nov. 8, 2007.

BACKGROUND

1. Technical Field

The invention relates to an electronic module and an electronic device.

2. Related Art

Generally, an electronic device is mounted with plural electronic modules. The respective electronic modules implement various functions by individual independent operations or an operation in cooperation with each other. Of the electronic modules, there is an electronic module having a board unit. The board unit is a unit having a circuit board mounted with various electronic parts. As this type of electronic module, there has been known a module in which attachment/detachment of the board unit to/from a module housing is performed by extracting/inserting the board unit.

In such an electronic module, when the board unit is inserted into the module housing, for example, a strong pressing force is required in order to fit a connector of a circuit board into a connector of another board. Also, when the board unit is extracted from the module housing, a strong drawing-in force is required in order to extract the connector of the circuit board from the connector of another board.

SUMMARY

According to an aspect of the invention, an electronic module includes a board unit and a module housing. In the board unit, a handle is attached to a panel portion of a unit main body on which a circuit board is mounted. The board unit is removably attached to the module housing. The handle includes a grip portion, and a pair of leg portions extending from both ends of the grip portion. The pair of leg portions is supported by a pair of support members fixed to the panel portion so that the pair of leg portions is rotatable in a direction along which the grip portion is brought into contact with and is separated from the panel portion. The pair of leg portions has engagement convex portions that extend from portions, serving as rotary pivots, of the leg portions toward a side opposite to the grip portion. The module housing includes, in a port portion through which the circuit board is taken in and out, an engagement concave portion that are provided so as to correspond to the engagement convex portions. When the board unit is inserted into the module housing, by rotating the handle around the rotary pivots in a direction along which the grip portion approaches the panel portion, the engagement convex portions are brought into contact with a part of the engagement concave portion to produce a force in a direction, along which the board unit is pressed into the module housing. When the board unit is extracted from the module housing, by rotating the handle around the rotary pivots in a direction along which the grip portion is separated from the panel portion, the engagement convex portions are brought into contact with another portion of the engagement concave portion to produce a force in a direction, along which the board unit is extracted from the module housing.

BRIEF DESCRIPTION OF THE DRAWINGS

Exemplary embodiments of the invention will be described in detail based on the following figures, wherein:

FIGS. 6A and 6B are perspective views showing the configuration of a support member;

DETAILED DESCRIPTION

Specific exemplary embodiments of the invention will be described in detail with reference to the accompanying drawings. It is noted that the technical scope of the invention is not limited to the exemplary embodiments described below, but also includes various modifications and improvements so long as the modifications and improvements can provide particular advantages obtained by constituent components of the invention and a combination of them.

Figure 1:
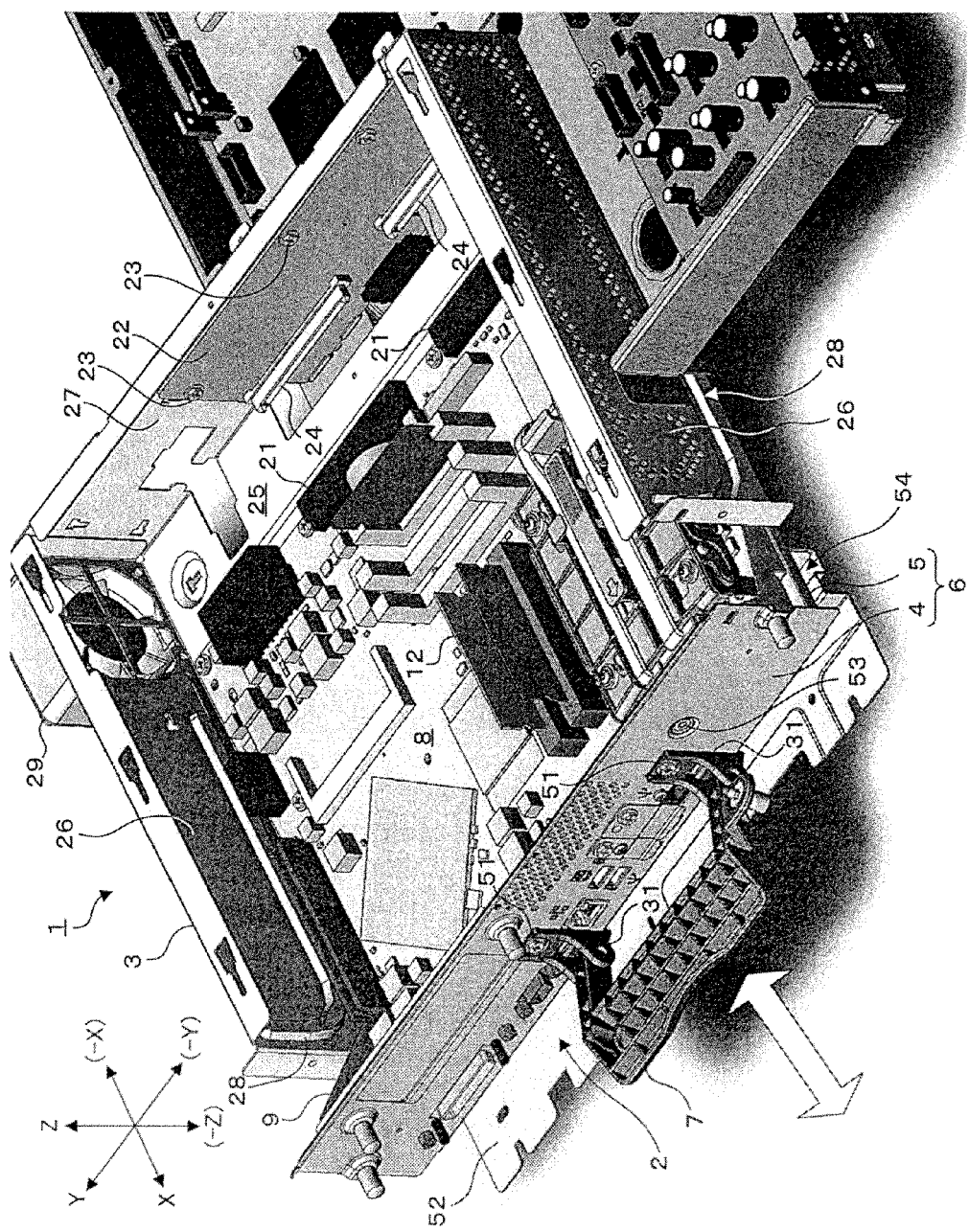
FIG. 1 is a perspective view showing the configuration of an electronic module according, to an exemplary embodiment of the invention.
Figure 2:
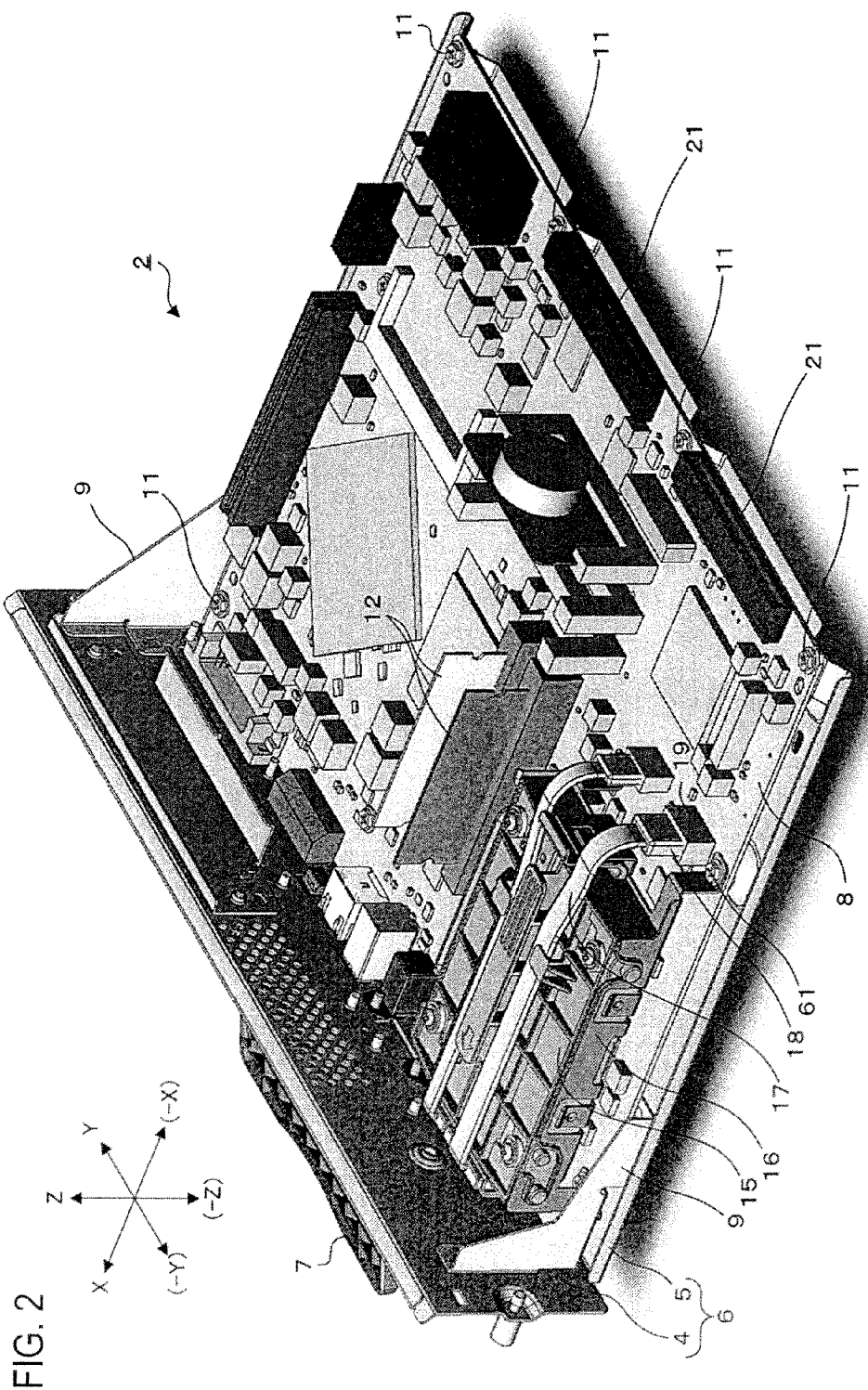
FIG. 2 is a perspective vides of a hoard unit which is a main component of the electronic module according to the exemplary embodiment of the invention.

FIG. 1 is a perspective view showing the configuration of the electronic module according to an exemplary embodiment of the invention. Further, FIG. 2 is a perspective view of a board unit which is a main component of the electronic module according to the exemplary embodiment of the invention.

An electronic module 1 mainly includes a board unit 2 and a module housing 3. The electronic module 1 can be built in various electronic devices, for example, a main body portion of an image forming apparatus 100 shown in FIG. 3. The image forming apparatus 100 constitutes for example, a digital copying machine or a digital multifunction device. The digital multifunction device has at least two functions of plural functions including a scanning function, a copying function and a facsimile function, in a complex way. For the convenience of a user who performs various operations with standing in front of the image forming apparatus 100 or who sets an original document and sheets of paper in the image forming apparatus 100, it is necessary to preferentially arrange an operational portion, an original-document tray, and a paper feed tray in the image forming apparatus 10. Further, it is necessary to provide an opening/closing door for solving paper-jam and a post processing device on a side surface of the image forming apparatus 100. Therefore, the electronic module 1 is disposed on a back side of the image forming apparatus 100.

The board unit 2 is removably attached to the module housing 3. As shown in FIGS. 1 and 2, the board unit 2 includes a unit main body 6 having a panel portion 4 and a board attachment portion 5 integrally a handle 7 attached on the outer side surface of the panel portion 4, a circuit board 8 attached to the board attachment portion 5, and a pair of reinforcement members 9.

In this specification, a direction in which the board unit 2 is inserted into or extracted from the module housing 3 is defined as an X-axis direction. Further, a direction which is parallel to a board surface of the circuit board 8 and orthogonal to the X-axis direction is defined as a Y-axis direction. A direction which is vertical to the board surface of the circuit board 8 and orthogonal to the X-axis direction and the Y-axis direction is defined as a Z-axis direction. The orthogonal three-axis directions of the defined X-axis direction, Y-axis direction and Z-axis direction will be used to specify the structures of respective parts of the electronic module 1 and a positional relation therebetween. Further, the X-axis direction is divided into an X direction and a –X direction, depending on its pointing direction. Similarly, the Y-axis direction is divided into a Y direction and a –Y directions and the Z-axis direction is divided into a Z direction and a –Z direction.

Figure 4:
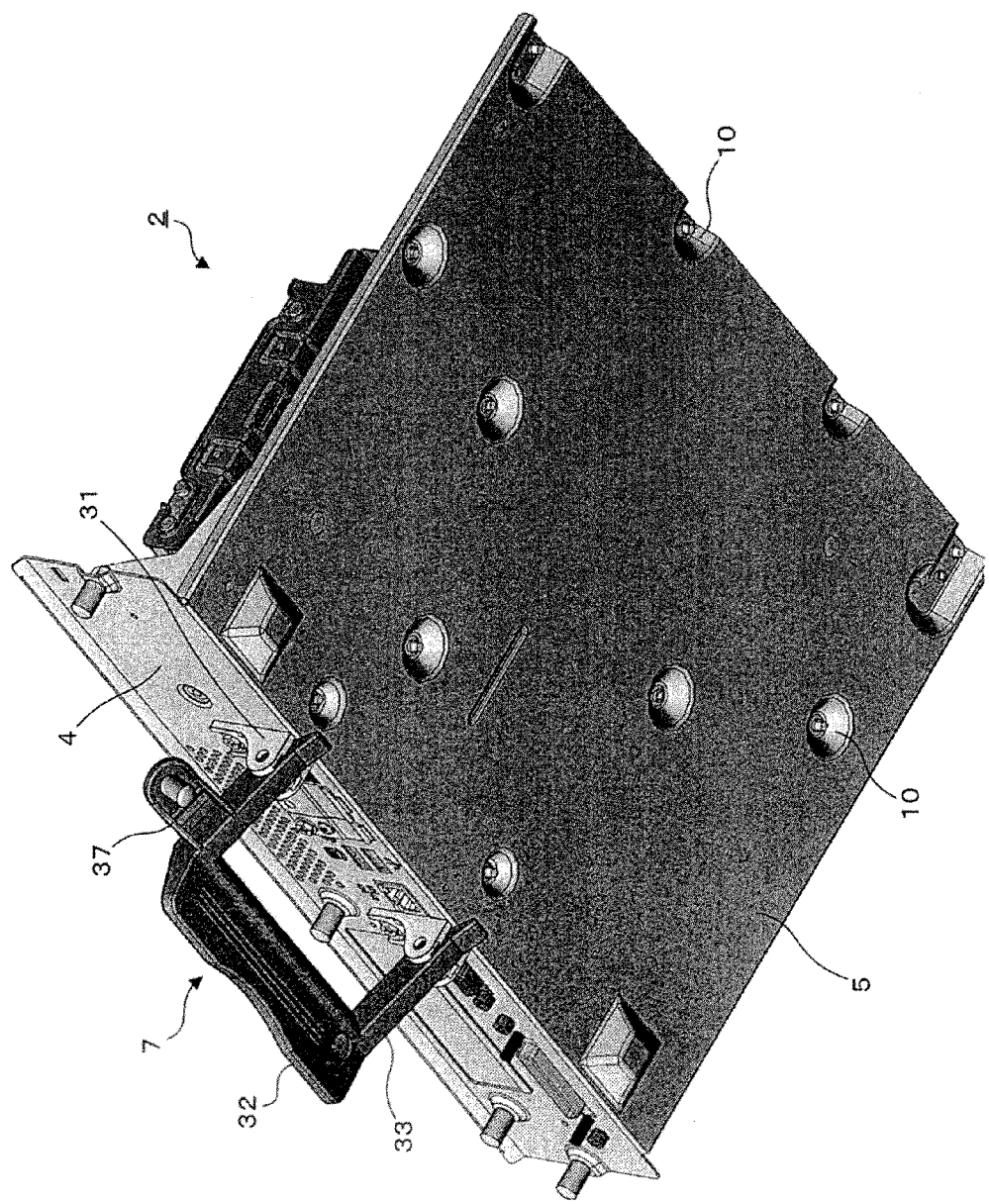
FIG. 4 is a perspective view of the board unit when viewed from the lower surface side.

The unit main body 6 is formed of a metal plate-shaped member having a substantially L shape when seen in the Y-axis direction. The panel portion 4 of the unit main body 6 is formed in the plate shape extending along Y-Z coordinate plane. The board attachment portion 5 of the unit main body 6 is formed in the plate shape extending along an X-Y coordinate plane vertical to the Y-Z coordinate plane. The circuit board 8 is mounted on the board attachment portion 5 of the unit main body 6. The circuit board 8 is attached to the board attachment portion 5 by plural screws 11. As shown in FIG. 4, concave portions 10 are provided on the rear side (part not-mounting side) of the board attachment portion 5 so as to correspond to the attachment positions of the screws 11.

The circuit board 8 is formed by using a rigid board such as a glass epoxy board as a base, and formed in the rectangle shape when seen from the Z-axis direction. The peripheral portion of the circuit board 8 is fixed to the board attachment portion 5 of the unit main body 6 by the plural screws 11. A hard disk (not shown) serving as an information storage device is mounted, as an example of electronic parts on the circuit board 8 as well as a memory board 12 and other electronic parts. The hard disk is mounted on the circuit board 8 in a floating state by an attachment unit including a casing 15 for accommodating the hard disk therein and a bracket 16 to which the casing 15 is detachably attached. The bracket 16 is fixed to the board attachment portion 5 of the unit main body 6 together with the circuit board 8 by the screws 11. A connector 18 of a cable 17 connected to the hard disk is inserted into a socket 19 provided on the circuit board 8.

Further, two female connectors 21 are provided, as an example of electronic parts, at an end side portion of the circuit board 8 on the side opposite to the panel portion 4. The two female connectors 21 are arranged along the end side portion of the circuit board 8 and adjacent to each other in the Y-axis direction. A connection port of each female connector 21 is provided to face in the –X direction. On the other hand, a relay board 22 is provided on the interior side of the module housing 3 (on the side opposite to the panel portion 4). The relay board 22 is attached to the module housing 3 by plural screws 23. Two male connectors 24 are provided on the relay board 22. The relay board 22 is used to relay electrical connection of the circuit board 8 in the electronic module 1 to a circuit board of another module. The male connectors 24 are fitted into the female connectors 21. Fitting between the female connectors 21 and the male connectors 24 is performed by inserting the connectors in the X-axis direction. Further, detachment between the male connectors 24 and the female connectors 21 is performed by extracting the connectors in the X-axis direction. Therefore, the insertion/extraction direction of the board unit 2 in relation to the module housing 3 is set to the X-axis direction.

The module housing 3 has a box-shaped structure including a space for accommodating the circuit board 8 therein (hereinafter, which will be referred to as "board accommodation space"), and an opening for taking the circuit board 8 in/out (hereinafter, which will be referred to as a "board take-in/out opening"). The module housing 3 is made of a metal material including iron as a main material, and the surface of the metal material is subjected to plating (for example, chromium oxide plating) for the purpose of rust preventing. The module housing 3 includes a base portion 25 provided in a position where the base portion 25 faces the board attachment portion 5 in the Z-axis direction, a pair of guide plates 26 opposed to each other in the Y-axis direction, an end plate 27 provided in a position where the end plate 27 faces the panel portion 4 in the X-axis direction, and a lid plate (not shown) provided in a position where the lid plate faces the base portion 25 through the board accommodation space in the Z-axis direction. Among them, the base portion 25, the pair guide plates 26, and the end plate 27 are integrated by bending, punching, welding, and the like of the metal plate. The lid plate (not shown) is attached to this integrated structure so as to cover the board accommodation space. In this case, the board take-in/out opening of the module housing 3 is arranged to direct toward one side (X-direction) of the X-axis direction. The relay board 22 is attached onto the inner surface of the end plate 27 on the side opposite to the board take-in/out opening.

In the pair guide plates 26, elongated narrow projection portions 28 are formed in a state where they protrude to the inside. Each projection a portion 28 is used to guide a movement of the board unit 2, which is being extracted or inserted through the board take-in/out opening. Each of the projection portions 28 curves arcuately from the vicinity of the board take-in/out opening toward the end plate 27 side and thereafter extends linearly along the X-axis direction. On the other hand, in the board unit 2, both end portions in the Y-axis direction of the board attachment portion 5 extend along the projection portions 28. Thereby the board unit 2 is permitted to move in the X-axis direction while the position of the board unit 2 in the Z-axis direction is regulated in the module housing 3. A fan 29 is attached onto the outside surface of one of the guide plates 26. The fan 29 is used to exhaust air (heat) in the board accommodation space through ventilation holes provided in the guide plate 26 to the outside.

Figure 5:
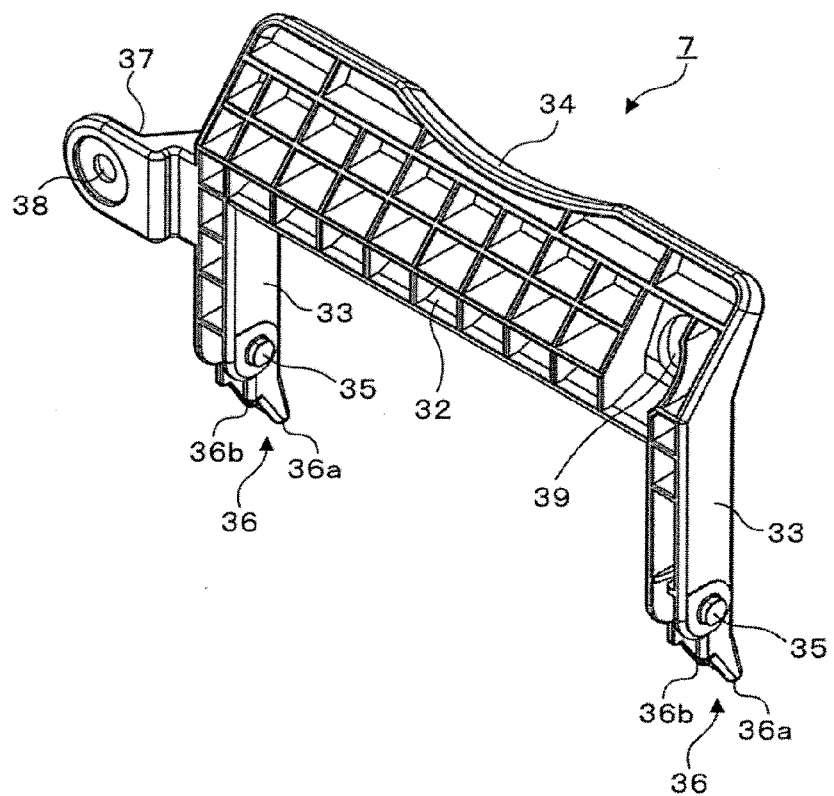
FIG. 5 is a perspective view showing the configuration of a handle.
Figure 7:
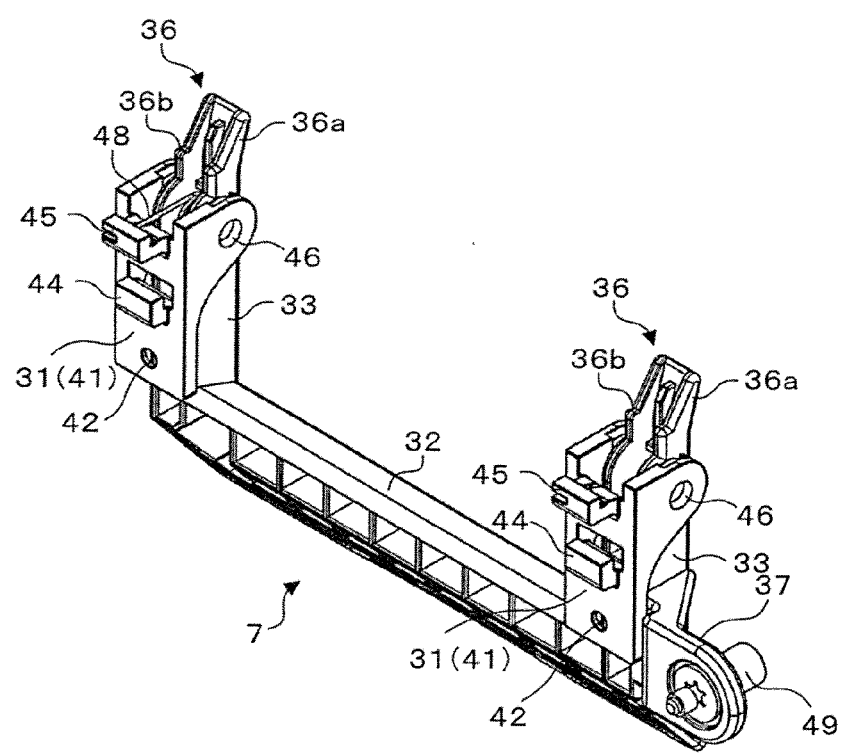
FIG. 7 is a perspective view (part 1) showing a state where the support member is attached to the handle.
Figure 8:
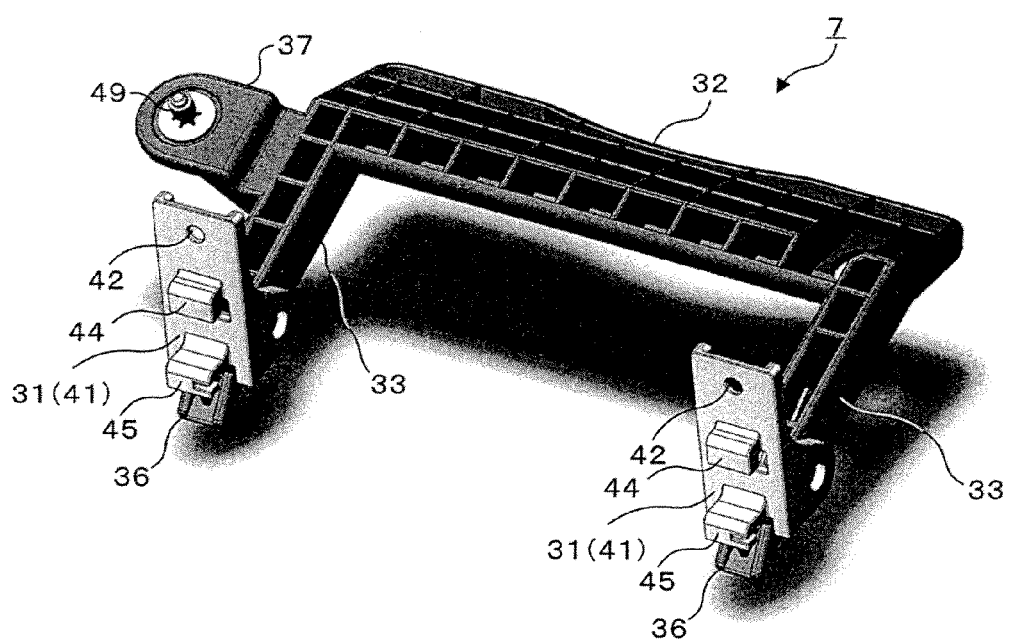
FIG. 8 is a perspective view (part 2) showing a state where the support member is attached to the handle.
Figure 9:
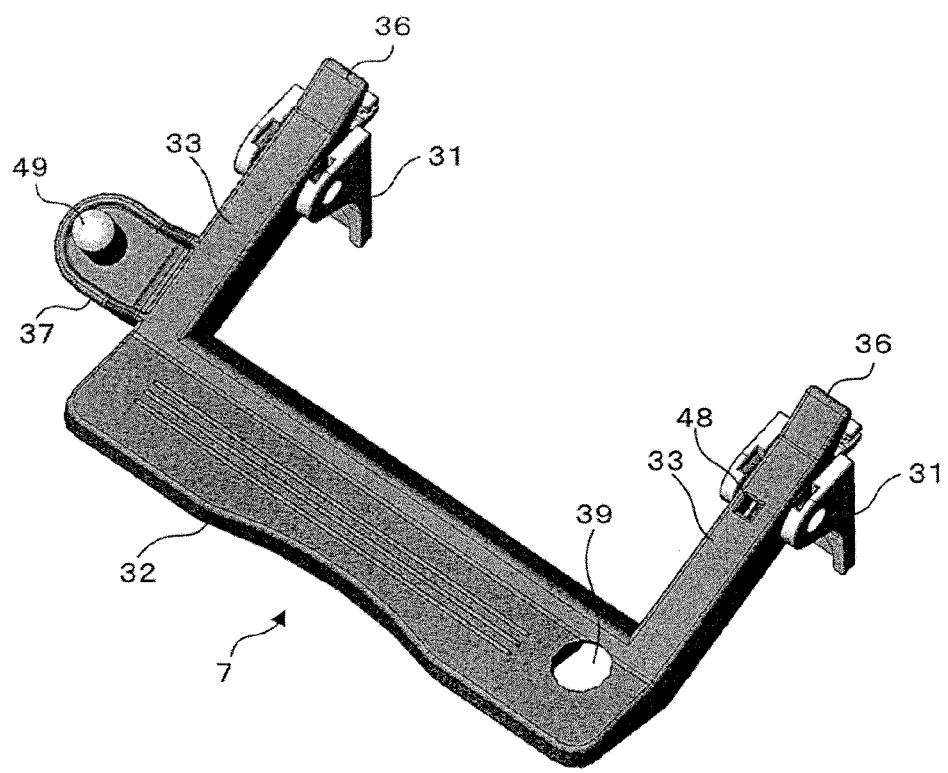
FIG. 9 is a perspective view (part 3) showing a state where the support member is attached to the handle.

The handle 7 is formed of an integrated resin-molded product, and is supported by the panel portion 4 using a pair of support members 31. FIG. 5 is a perspective view showing the configuration of the handle. FIGS. 6A and 6B are perspective views showing the configuration of the support member. Further, FIGS. 7 to 9 are perspective views showing a state where the supporting members are attached to the handle when seen from different directions.

(Configuration of Handle)

The handle 7 is configured to include a grip portion 32 and a pair of leg portions 33 integrally. In the grip portion 32, an arcuate recess portion 34 is formed. The length of the grip portion 32 in the Y-axis direction (that is, the distance between the leg portions 33) is set to at least about 100 mm so that a worker who inserts/extracts the board unit 2 can easily grip the handle 7 with his hand in a state where the handle 7 is attached to the panel portion 4. Further, the handle 7 is attached to the panel portion 4 by the pair of support members 31 in a state where the pair of leg portions 33 straddles a center of the panel portion 4 in the Y-axis direction that is the longitudinal direction of the pallet portion 4.

The pair of leg portions 33 extends from both end portions of the grip portion 32 in the same direction (a direction at right angles to the (rip portion 32). A rotary pivot 35 and an engagement convex portion 36 are provided on one side of each leg portion 33. Each rotary pivot 35 is formed to have, in section, a circular-pin shape (a round pin shape). Further, the rotary pivots 35 are provided so as to protrude from the both sides of the leg portions 33 outwardly in a longitudinal direction of the drip portion 32. Each engagement convex portions 36 is provided at an extension end of the corresponding leg portion 33 so as to protrude from the rotary pivot 35 toward the side opposite to the grip portion 32. In the length direction of each leg portion 33, the distance between the rotary pivot 35 and the grip portion 32 is set to be several times (for example, twice) as long as the distance between the rotary pivot 35 and the protrusion end of the engagement convex portion 36. Each engagement convex portion 36 has a nose portion 36a and a jaw portion 36b integrally. Further, one of the leg portions 33 is provided with an arm portion 37. The arm portion 37 is provided so as to protrude from the leg portion 33 outwardly. In the arm portion 37, a stepped through-hole 38 is provided. Further, in one end portion of the grip portion 32 in the longitudinal direction (an end portion on the side opposite to the arm portion 37), an escape hole 39 is provided.

(Configuration of Support Member)

Each support member 31 is formed of an integrated resin-molded product, and is used to attach the handle 7 to the panel portion 4. Each support member 31 includes integrally a back plate portion 41 which is substantially rectangle, a fixing hole 42 provided in one end portion of the back plate portion 41 in the longitudinal direction, a pair of pivot support portions 43 protruding from both long side portions of the back plate portion 41 toward one direction, and a hook portion 44 and a spring hook portion 45 which protrude toward the back surface side of the back plate portion 41.

Each fixing hole 45 is used to screw the corresponding support member 31 to the panel portion 4. The pair of pivot support portions 43 are used to pivotally support the rotary pivots 35 provided in the leg portion 33 of the handle 7. In the pair of pivot support portions 43, circular holes 46 are provided on the same axis. Further, a guide groove 47 is provided to be directed toward this hole 46. The guide groove 47 is inclined toward the hole 46. The rotary pivots 35 are fitted to the holes 46. Therefore, the inner diameter of the hole 46 and the groove width of the guide groove 47 are set corresponding to the outer diameter of the rotary pivot 35. Each hook portion 44 is formed in the hook shape. If the handle 7 is attached through the support members 31 to the panel portion 4, the hook portions 44 are caught by square holes (not shown) provided in the panel portion 4. Each spring hook portion 45 is used to catch one end portion of a torsion coil spring which will be described later.

If the support member 31 is attached to the thus-configured handle 7, the rotary pivots 35 provided in the leg portion 33 of the handle 7 are fitted into the holes 46 of the support member 31. At this time, when the rotary pivots 35 of the leg portion 33 are fitted into the guide grooves 47 of the pivot support portions 43 and then, the rotary pivots 35 are pressed toward the holes 46, the pair of pivot support portions 43 deforms in response to reception of its pressing force so as to escape the pressing force outwardly. As soon as the rotary pivots 35 is fitted into the holes 46, the deformation of the pair pivot support portions 43 is released, and simultaneously detachment of the rotary pivots 35 is prevented. At this time, a torsion coil spring 48 serving as an urging member is attached to one of the leg portions 33 (in the figure, the leg portion 33 on the side opposite to the arm portion 37). The torsion coil springs 48 may be attached to the both leg portions 33. Further, a pickup screw 49 is rotatably attached to the arm portion 37 of the handle 7 using the through-hole 38.

Figure 10:
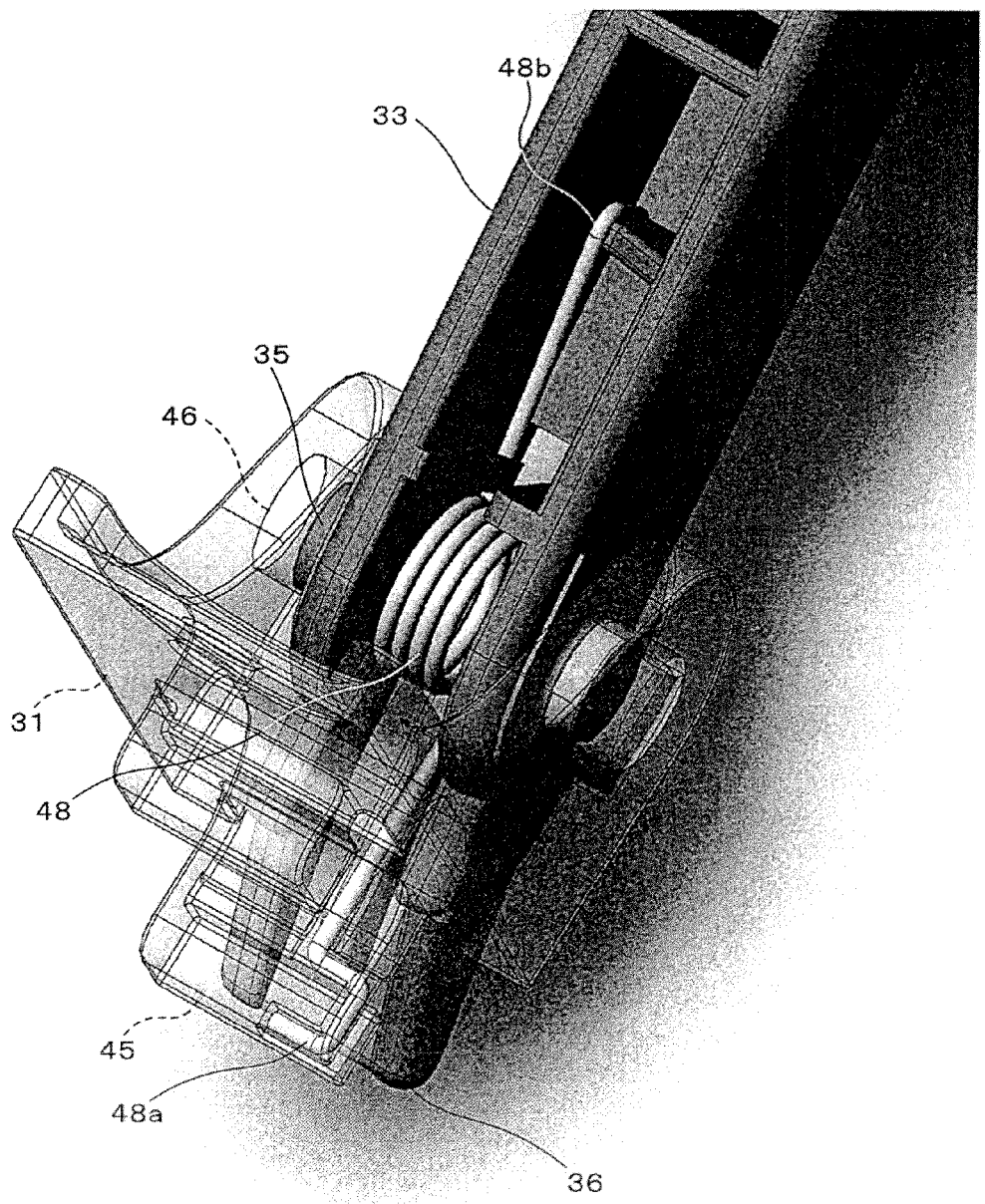
FIG. 10 is a perspective view showing an attachment state of an urging member.

FIG. 10 is a perspective view showing an attachment state of the urging member. As shown in FIG. 10, one end portion 48a of the torsion coil spring 48 is caught in the spring hook portion 45 of the support member 31. Further, the other end portion 48b of the torsion coil spring 48 is caught in the leg portion 33. If the handle 7 is attached to the panel portion 4 by the pair of support members 31, the torsion coil spring 48 urges the handle 7 in a direction along which the grip portion 32 is separated from the panel portion 4, of directions in which the handle 7 rotates around the rotary pivots 35.

If the handle 7 is attached to the panel portion 4, previous to the attachment operation, the support member 31 is attached to each leg portion 33 of the handle 7 (the torsion coil spring 48 is attached to one of the leg portions 33), and the pickup screw 49 is attached to the arm portion 37 of the handle 7. Then, the pair of support members 31 attached to the handle 7 are pressed against the outer surface of the panel portion 4. At this time, the hook portions 44 protruding from the back plate portions 41 of the support members 31 are caught in the holes (not shown) of the panel portion 4, and the back surfaces of the back plate portions 41 are brought into contact with the outer surface of the panel portion 4. In the panel portion 4, an escape portion (not shown) for avoiding contact with the spring hook portions 45 is provided. Therefore, the back plate portions 41 of the support members 31 are pressed against the outer surface of the panel portion 4 with no clearance. Further, the fixing hole 42 of each support member 31 is aligned coaxially with a screw hole (not shown) which is provided in the panel portion 4 so as to correspond to this fixing hole 42, and a fixing screw 51 (see FIG. 1) is fitted into the screw hole 42 and tightened. Thereby, the support members 31 are fixed to the panel portion 4. Accordingly, the handle 7 is supported so as to be rotatable around (i) the rotation pivots 35 provided in the both let, portions 33 and (ii) the holes 46 of the support members 31 to which the rotary pivots 35 fit, in both of a direction along which the grip portion 32 approaches the panel portion 4 and a direction along which the grip portion 32 is separated from the panel portion 4.

In this specification, rotating the handle it in the direction along which the grip portion 32 approaches the panel portion 4 (hereinafter referred to as a "close direction") is referred to as a close operation of the handle 7, and rotating the handle 7 in the direction along which the grip portion 32 is separated from the panel portion 4 (hereinafter referred to as an "open direction") is referred to as an open operation of the handle 7.

Figure 3:
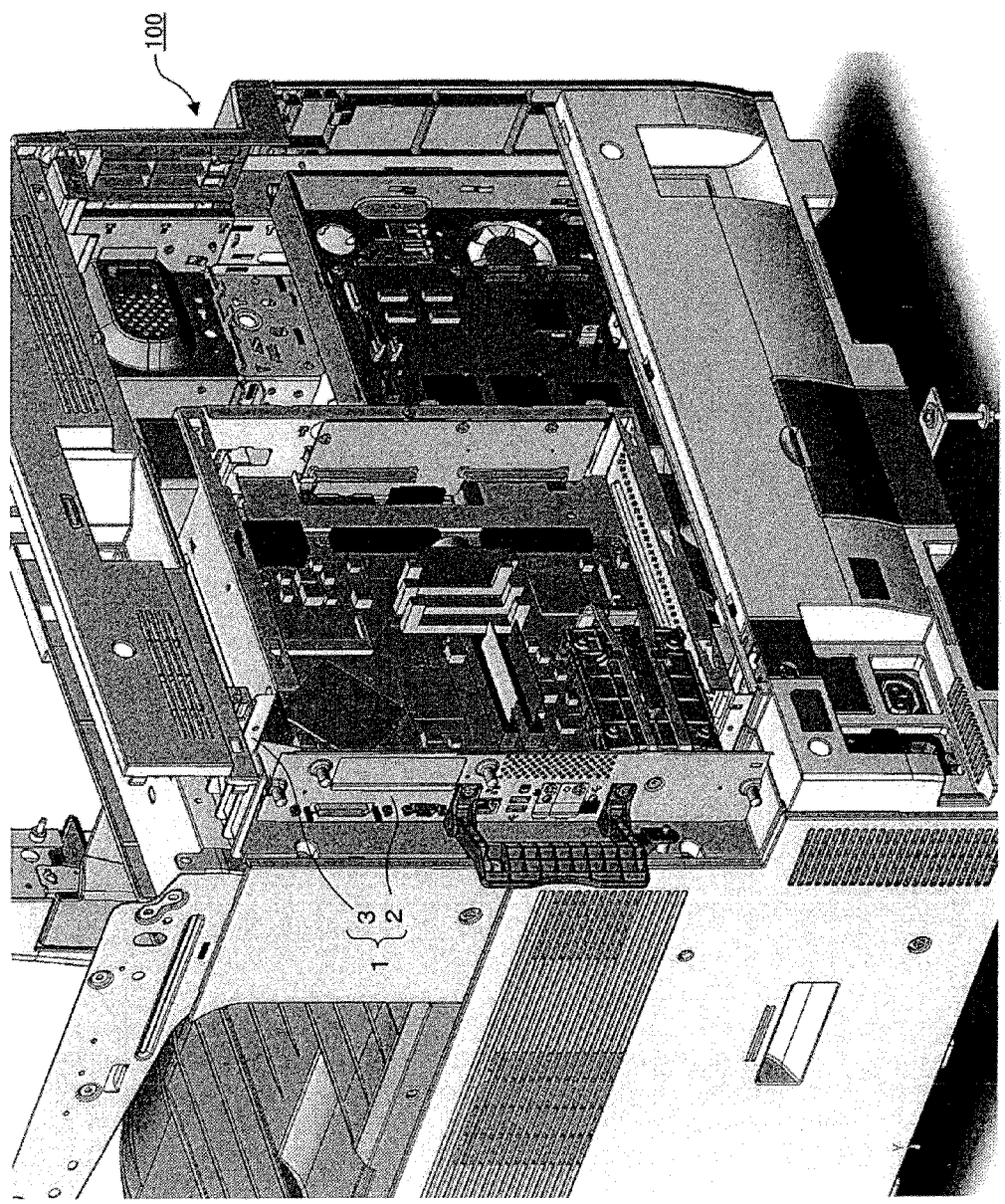
FIG. 3 is a perspective view of an image forming apparatus having the electronic module.

Further, a state where the handle 7 is rotated up to a position where the grip portion 32 comes closest to the panel portion 4 is referred to as a close state of the handle 7. A state where the handle 7 is rotated to a position where the (rip portion 32 is most apart from the panel portion 4 is referred to as an open state of the handle 7. In FIGS. 3 and 4, the urging force of the torsion coil spring 48 keeps the handle 7 being in the open state.

As described above, in the state where the handle 7 is attached to the panel portion 4, the engagement convex portion 36 existing at the extension end of each leg portion 33 of the handle 7 is disposed so as to protrude toward the back side of the board attachment portion 5. On the other hand, as shown in FIG. 1, an overhang portion 52 made of a metal is provided in the base portion 25 of the module housing 3, so as to overhang from the board take-in/out opening to the front side (X-direction). The overhang portion 52 may be fixed to the base portion 25 by welding, or may be formed integrally with the base portion 25. The overhang portion 52 is obtained by bending a metal plate. In the overhang portion 52, an engagement concave portion 54 is provided by bending the metal plate in a crank shape. The engagement concave portion 54 is provided in the board take-in/out opening portion so as to correspond to the engagement convex portions 36. The engagement concave portion 54 is formed in the concave shape when seen from the Y-axis direction. Further, the engagement concave portion 54 is formed straightly in the longitudinal direction (Y-axis direction) of the overhang portion 52.

(Attachment Operation of Board Unit)

The stand-alone board unit 2 is kept open by the urging force of the torsion coil spring 48. Since the enough space is secured between the grip portion 32 of the handle 7 and the panel portion 4 in this state, a worker can easily grip the grip portion 32 with his hand. Further, if the handle 7 and the support member 31 for supporting this handle 7 have a predetermined strength (for example, a maximum mechanical strength of about 70 kg in static load), the worker can utilize the handle 7 as a grip for carriage. Therefore the board unit 2 can be easily carried. Further, since a screw hole 53 (see FIG. 1) is provided in the panel portion 4 so as to correspond to the through-hole 38 provided in the arm portion 37 of the handle 7, by inserting the pickup screw 49 attached to the arm portion 37 into the screw hole 53 of the panel portion 4 and tightening the screw 49, the handle 7 can be kept closed against the urging force of the torsion coil spring 48. Therefore, if any work is performed in a state where the board unit 2 is kept attached to the module housing 3, the handle 7 can be folded in a compact size so as not to interfere with the work. However, if the board unit 2 is inserted and attached to the module housing 3, the pickup screw 49 is loosened to bring the handle 7 in the open state. In this case, as soon as the pickup screw 48 is loosened, the handle 7 is automatically kept opened by the urging force of the torsion coil spring 48. Therefore, if the board unit 2 is attached to the module housing 3, the rotational direction of the handle 7 is limited to the close direction. Accordingly, it is possible to prevent a so-called erroneous operation that the worker operates the handle 7 in the opposite direction in error.

If the board unit 2 is actually attached to the module housing 3, the board 2 is inserted from the board take-in/out opening of the module housing 3 into the module housing 3 so that the both end portions of the board attachment portion 5 of the board unit 2 are moved along the projection portions 28 provided in the pair guide plates 26 of the module housing 3. In this case, the worker who attaches the board unit 2 directly presses the outer surface of the panel portion 4 with his hand or presses the entirety of the board unit 2 while gripping the grip portion 32 of the handle 7 in one hand.

Figure 11:
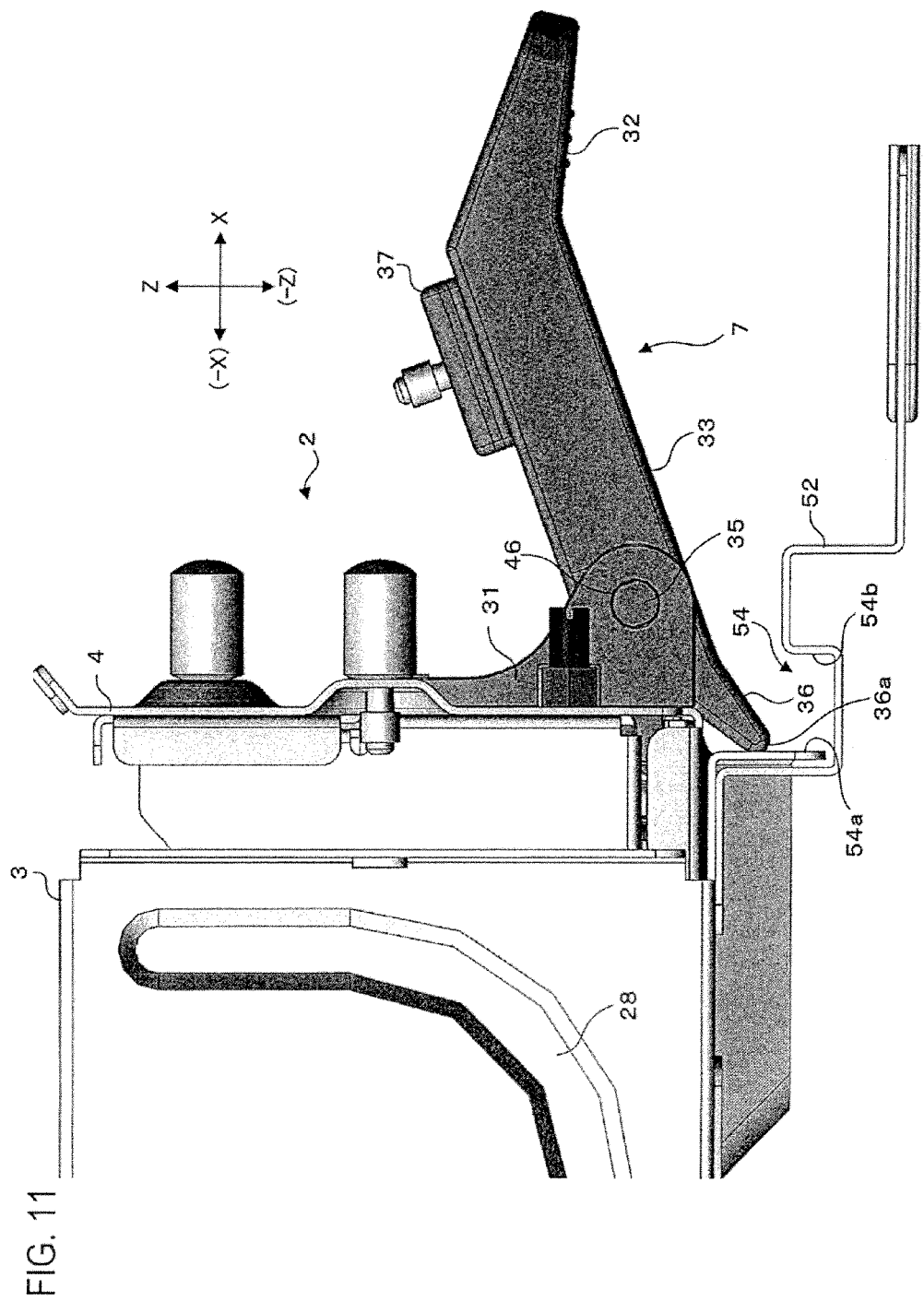
FIG. 11 is a diagram for explaining a first state relating to a rotating operation of the handle.

Thereafter, before the female connectors 21 of the circuit board 8 are fitted to the male connectors 24 of the relay board 22, the nose portions 36a of the engagement convex portions 36 of the handle 7 are brought into contact with one surface 54a of the engagement concave portion 54 as shown in FIG. 11. In FIG. 11, the handle 7 is in the open state. In this state, the handle 7 is arranged at the terminal position in the opening direction, and a predetermined clearance L secured in this terminal position between the grip portion 32 of the handle 7 and the overhang portion 52 which the grip portion 32 approaches. The clearance L is set to such a dimension (for example, to 30 mm or more) that when the handle 7 is rotated to the terminal position in the open direction, a finger of the worker who grips the grip portion 32 is prevented from being caught between the grip portion 32 and the overhang portion 52. Therefore, it is possible to prevent effectively the finger of the worker who grips the handle 7 from being caught.

Figure 12:
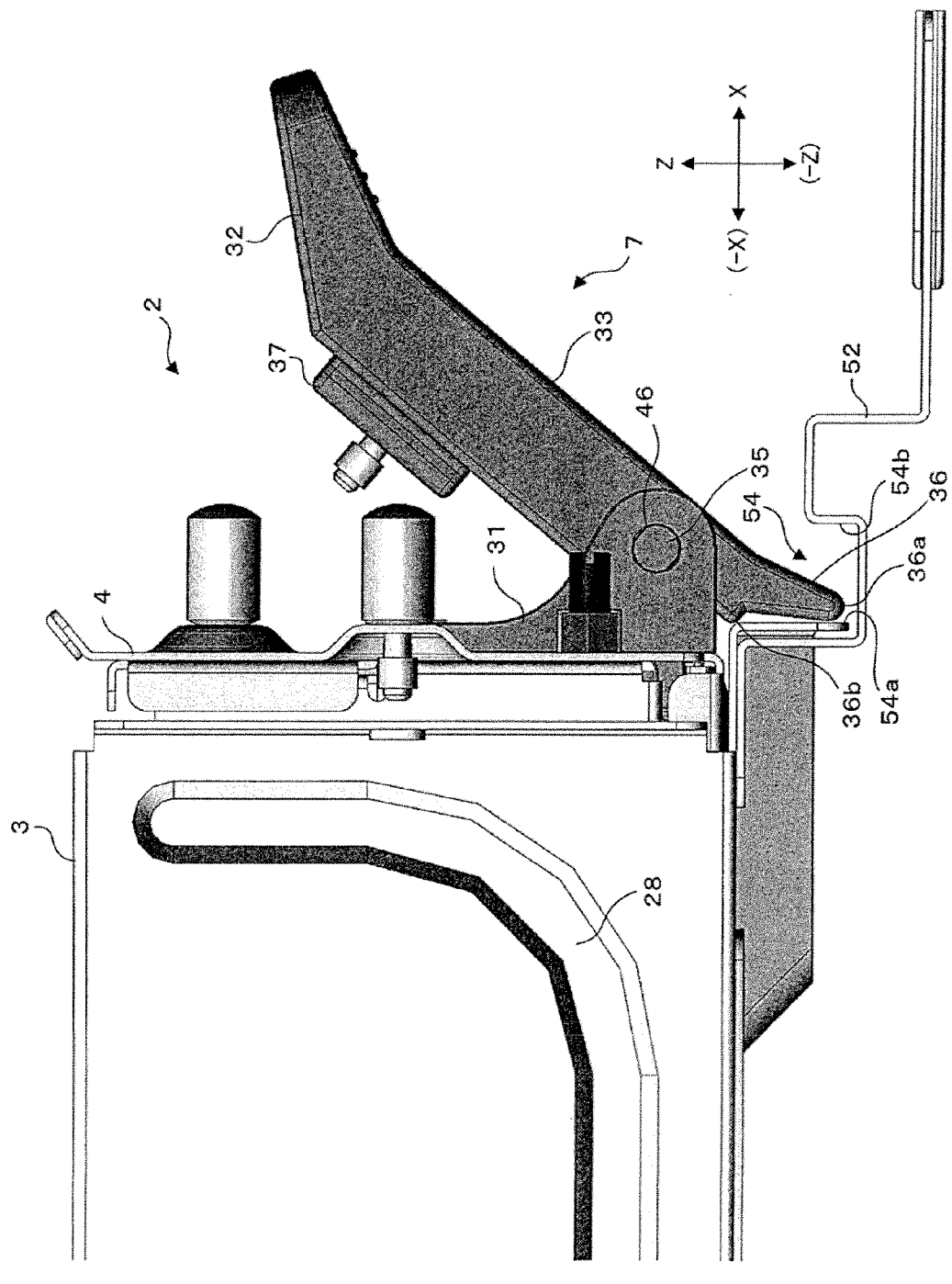
FIG. 12 is a diagram for explaining a second state relating to the rotating operation of the handle.

When the board unit 2 is further pressed in the –X direction from the state shown in FIG. 11, the pressing force acts on the engagement convex portions 36 against the urging force of the torsion coil spring 48. Therefore, the handle 7 receives the pressing force and is rotated around the rotary pivots 35 in the close direction. Accordingly, the worker who presses the board unit 2 into the module housing 3 by pressing the panel portion 4 with his hand or by griping the handle 7 in one hand can appropriately confirm which direction he should operate the handle 7 in, from the rotation direction of the handle 7 caused by the contact between the nose portions 36a of the handle 7 and the one-surface 54a of the engagement concave portion 54. Further, if the board unit 2 is further pressed from the state shown in FIG. 11, when the jaw portions 36b of the engagement convex portions 36 come close to or come into contact with the one-surface 54a of the engagement concave portion 54 as shown in FIG. 12, the female connectors 21 of the circuit board 8 come into contact with the male connectors 24 of the relay board 22, and the rotation of the hand 7 is stopped upon reception of its contact resistance (resistance produced in fitting between the connectors). In this step, the female connectors 21 come into mere contact with the male connectors 24, but the connectors 21 and 24 are in an unfitted state.

Thereafter, when the worker grips the grip portion 32 of the handle 7 in one hand and further rotates the handle 7 in the close direction, the nose portions 36a of the engagement convex portions 36 come into contact with the other surface 54b of the engagement concave portion 54. Furthermore, when the worker applies power to his hand which grips the grip portion 32 so as to further rotate the handle 7 in the close direction, a force in a direction along which the board unit 2 is pressed into the module housing 3 is produced with the contact portion between the engagement convex portion 36 and the engagement concave portion 54 serving as a load in the principle of leverage. At this time, the worker operates and rotates the handle 7 up to the close position.

Figure 13:
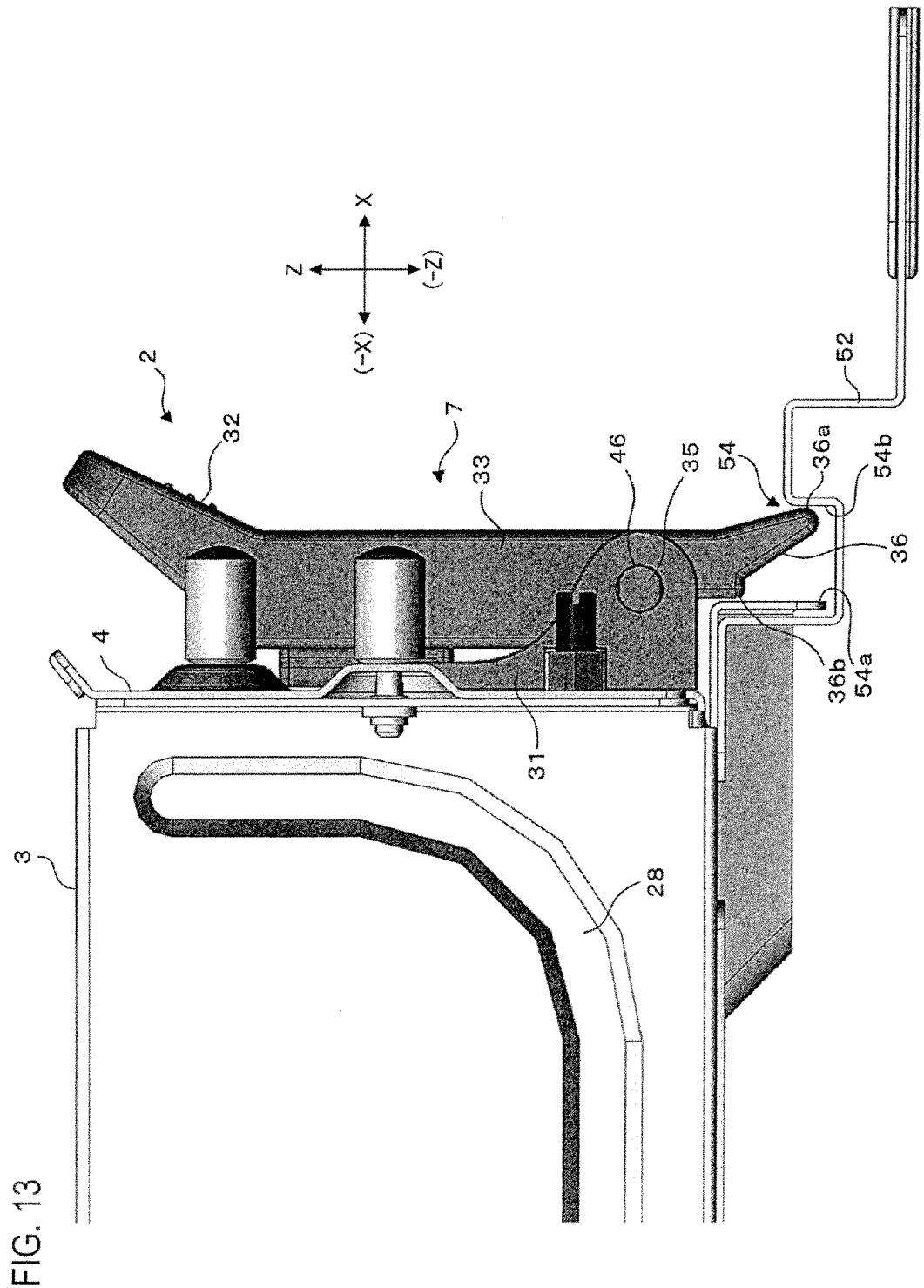
FIG. 13 is a diagram for explaining a third state relating to the rotating operation of the handle.
Figure 14:
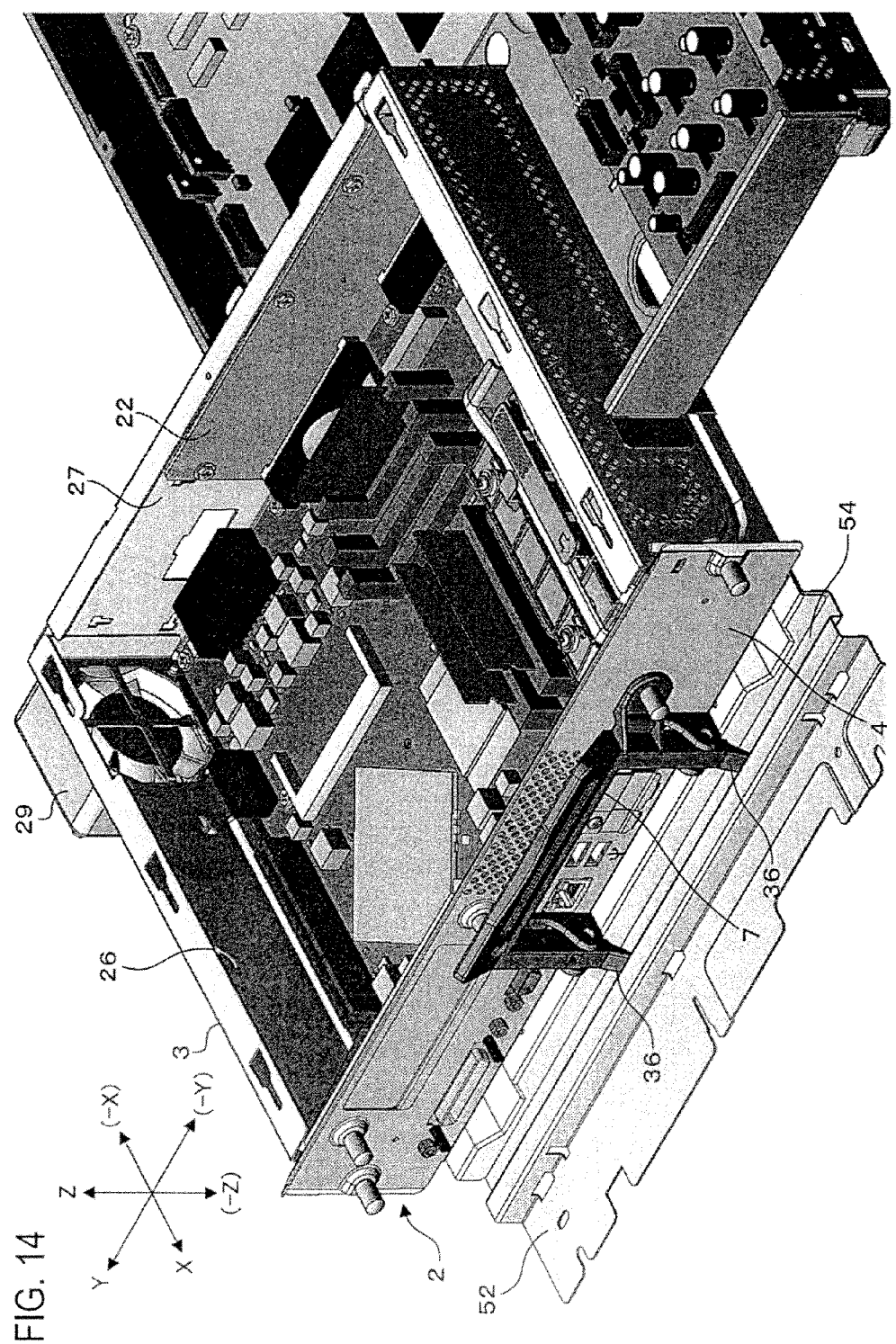
FIG. 14 is a perspective view showing a state of the electronic module when the hoarse unit is inserted into a module housing by closing the handle.
Figure 15:
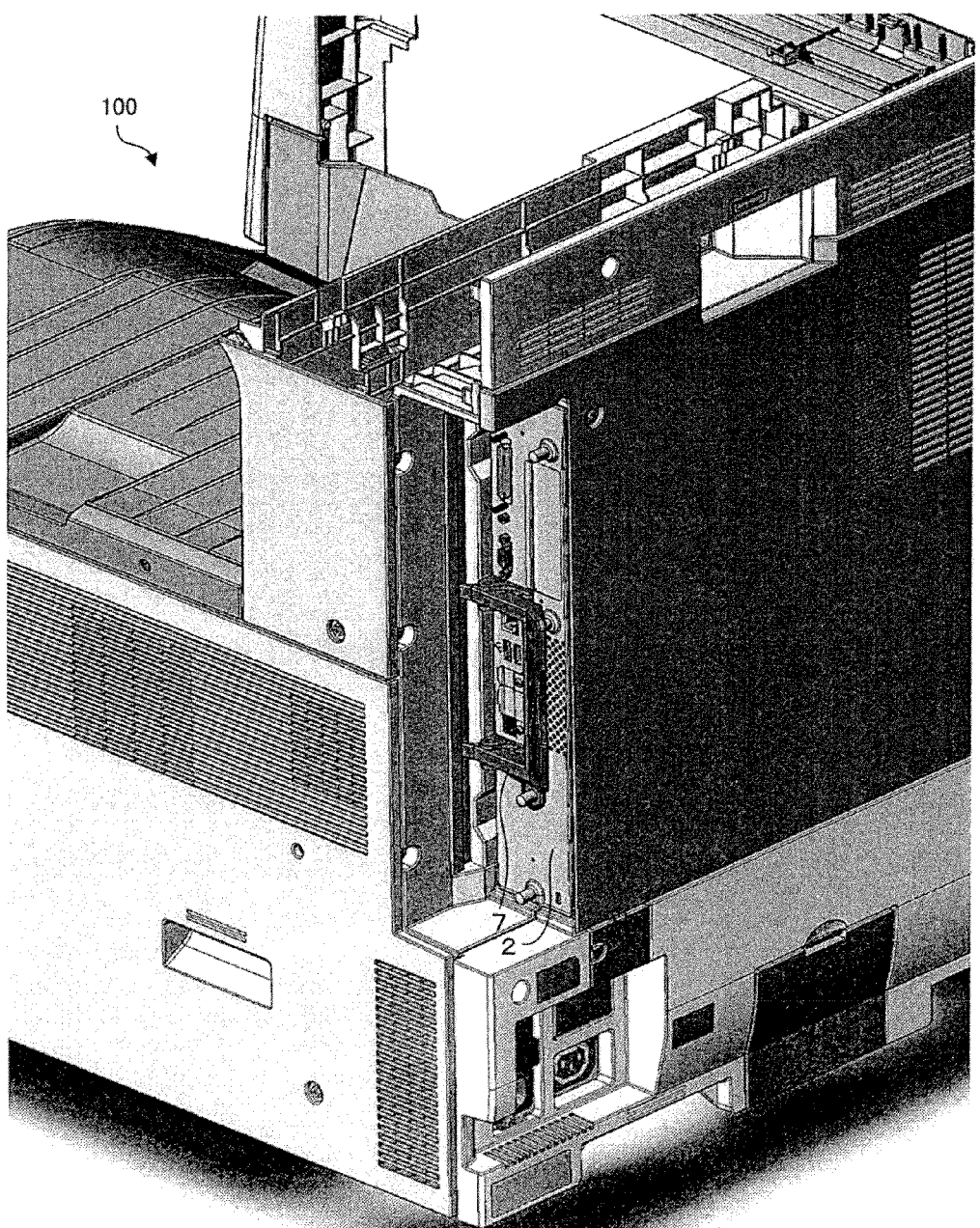
FIG. 15 is a perspective view showing a state of an image forming apparatus when the hoard unit is inserted into the module housing by closing the handle.

FIG. 13 is a diagram showing a state where the handle 7 is rotated up to the close position. In the process in which the handle 7 is thus rotated from the position shown in FIG. 12 to the close position shown in FIG. 13, the contact portions between the nose portions 36a of the engagement convex portions 36 and the other surface 54b of the engagement concave portion 54 serve the loads in the principle of leverage, the rotary pivots 35 serve as a fulcrum in the principle of leverage, and the grip portion 32 of the handle 7 serves as en effort in the principle of leverage. In this case, since the distance between the fulcrum and the effort is longer than the distance between the fulcrum and the load, even if a relatively small force is applied to the effort, very large force can be produced on the load, and its reaction force presses the board unit 2 with the strong force into the interior of the module housing 3 (in the −X direction). Accordingly, if the board unit 2 is pressed up to a specified position of the module housing 3, it is possible to generate the strong pressing force required to fit the female connectors 21 of the circuit board 8 to the male connectors 24 of the relay board 22 even by the one-handed operation using the handle 7. Herein, as an example, the position where the male and female connectors are fitted to each other is taken as an example of the "specified position". FIG. 14 is a perspective view showing a state of the electronic module where the board unit is pressed into the module housing by the close operation of the handle. FIG. 15 is a perspective view showing a state of the image forming apparatus where the board unit is pressed into the module housing by the close operation of the handle.

Further, in the configuration of the board unit 2, the leg portions 33 of the handle 7 are arranged so as to straddle a center of the panel portion 4 in the longitudinal direction. Therefore, the two portions of the panel portion 4, in the longitudinal direction, corresponding to the attachment positions of the pair of support members 31 are pressed into the interior of the module housing 3 by the principle of leverage during the close operation time of the handle 7. By the close operation of the handle 7, it is possible to apply the pressing force to the board unit 2 with good balance. Accordingly, the board unit 2 can be pressed straightly along the X-axis direction. Therefore, the male and female connectors are easily fitted to each other.

(Detachment of Board Unit)

Figure 16:
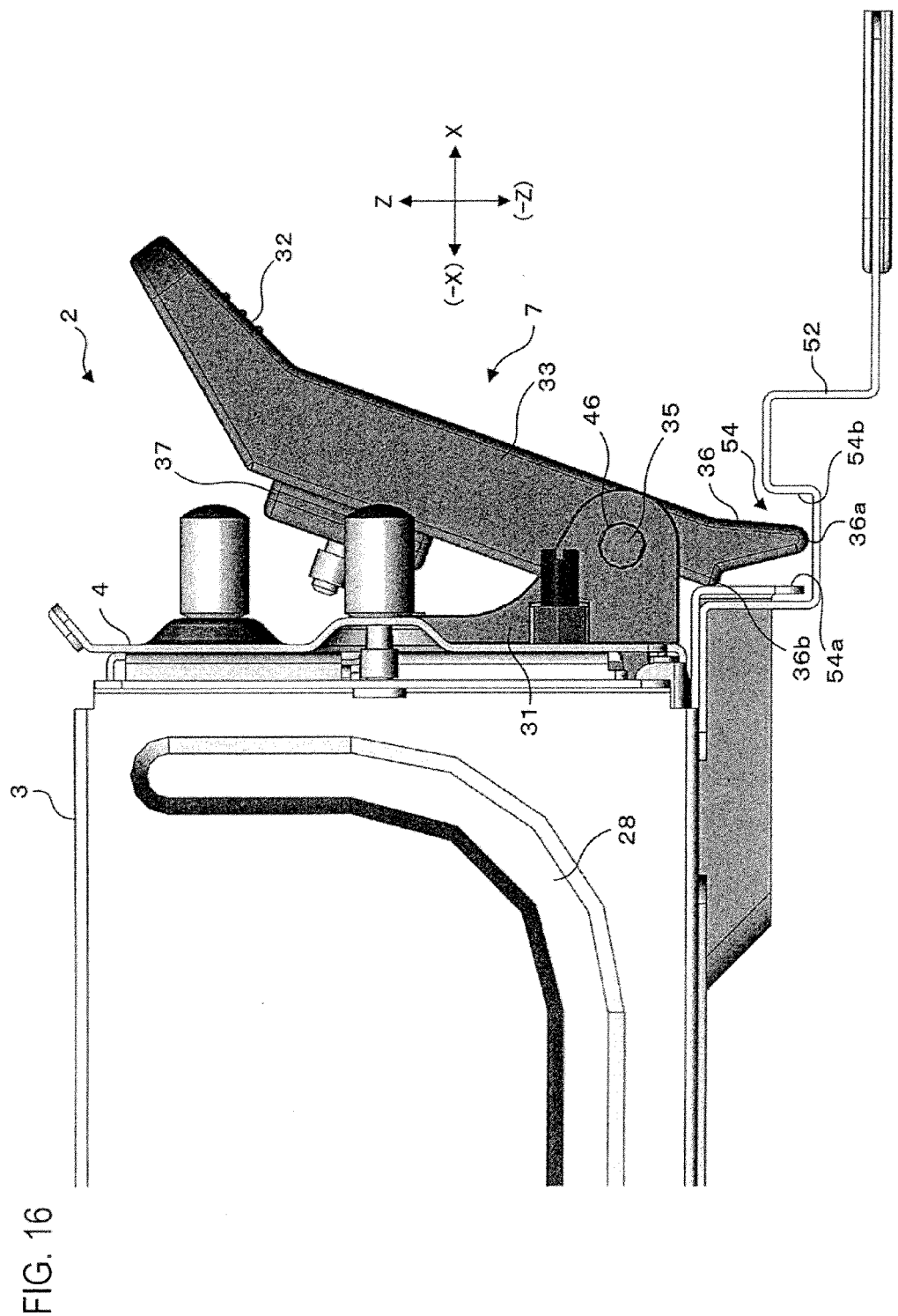
FIG. 16 is a diagram ter explaining a fourth state relating to the rotating operation of the handle.
Figure 17:
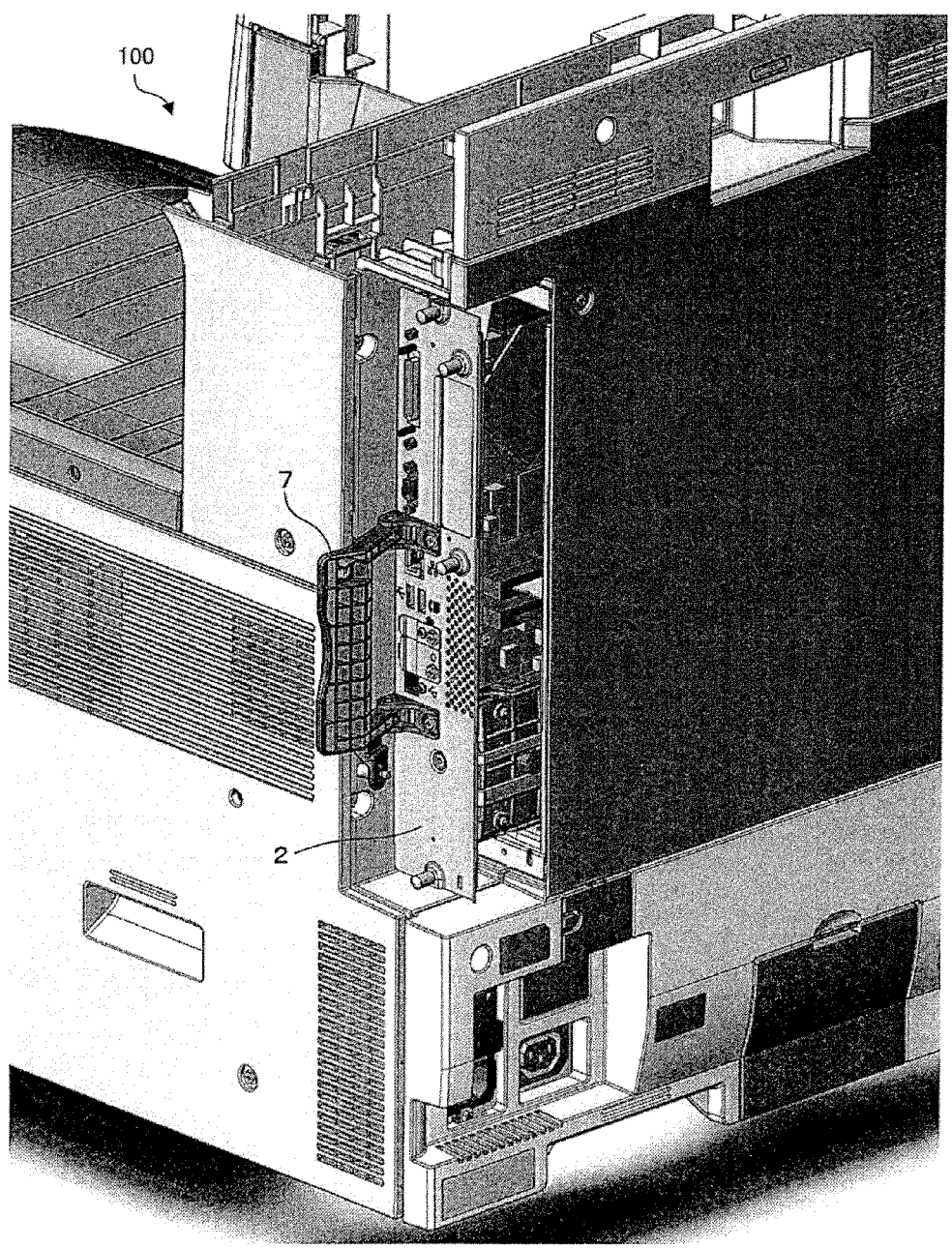
FIG. 17 is a perspective view showing a state of the image forming apparatus when a part of the board unit is drawn out from the module housing by opening the handle.

On the other hand, if the board unit 2 is detached from the module housing 3 by extraction, a worker who performs the detachment work grips the grip portion 32 of the handle 7 in one hand and rotates the handle 7 in the open direction. At this time, when the worker applies a force to his hand which grips the grip portion 32 so as to rotate the handle 7 in the open direction, a force in a direction along which the board unit 2 is drawn out from the module housing 3 is produced with the contact portion serving as a load in the principle of leverage in a state where the jaw portions 36b of the engagement convex portions 36 are in contact with the one surface 54 of the engagement concave portion 54 as shown in FIG. 16. In this case, the contact portions between the jaw portions 36b of the engagement convex portions 36 and the one surface 54a of the engagement concave portion 54 become a load in the principle of leverage. The rotary pivots 35 serve as a fulcrum in the principle of leverage. The grip portion 32 of the handle 7 serves as an effort in the principle of leverage. Because of the reason similar to the above, even if a relatively small force is applied to the effort, very large force is produced on the toad, and its reaction force draws the board unit 2 into the front side of the module housing 3 (in the X direction) with the strong force. Accordingly, if the board unit 2 attached to the specified position of the module housing 3 is drawn out, it is possible to generate the strong drawing-in force required to extract the female connectors 21 of the circuit board 8 from the male connectors 24 of the relay board 22 even by the one-handed operation using the handle 7. FIG. 17 is a perspective view showing a state of the image forming apparatus where a part of the board unit is drawn out from the module housing by the open operation of the handle.

Further, as described above, the leg portions 33 of the handle 7 are arranged so as to straddle the center of the panel portion 4 in the longitudinal direction. Therefore, the two portions of the panel portion 4, in the longitudinal direction, corresponding to the attachment positions of the pair support members 31 are drawn out to the front side of the module housing 3 by the principle of leverage during the open operation time of the handle 7. Therefore, it is possible to apply the drawing-in force to the board unit 2 with good balance by the open operation of the handle 7. Accordingly, the board unit 2 can be drawn in straightly along the X-axis direction. The male and female connectors are easily detached from each other.

What is claimed is:

1. An electronic module comprising:
    a board unit including
        a board attachment portion on which a circuit board is mounted, and
        a panel portion to which a handle is attached; and
    a module housing to which the board unit is removably attached, wherein the handle includes
        a grip portion, and
        a pair of leg portions extending from both ends of the grip portion,
    a length of the handle in a longitudinal direction of the handle is shorter than that of the panel portion in the longitudinal direction,
    the pair of leg portions is supported by a pair of support members fixed to the panel portion so that the pair of leg portions is rotatable in a direction along which the grip portion is brought into contact with and is separated from the panel portion,
    the support members are fixed to the panel portion at an interval which is shorter than the length of the panel portion in the longitudinal direction of the handle,
    the pair of leg portions has engagement convex portions that extend from portions, serving as rotary pivots, of the leg portions toward a side opposite to the grip portion, and protrudes from one side of the board attachment portion on which the circuit board is not provided,
    the module housing includes, in a port portion through which the circuit board is taken in and out, engagement concave portions that are provided so as to correspond to the engagement convex portions and that extend along the longitudinal direction of the handle,
    when the board unit is inserted into the module housing, by rotating the handle around the rotary pivots in a direction along which the grip portion approaches the panel portion, the engagement convex portions are brought into contact with a part of the engagement concave portion to produce a force in a direction, along which the board unit is pressed into the module housing; and
    when the board unit is extracted from the module housing, by rotating the handle around the rotary pivots in a direction along which the grip portion is separated from the panel portion, the engagement convex portions are brought into contact with another portion of the engagement concave portion to produce a force in a direction, along which the board unit is extracted from the module housing.

2. The electronic module according to claim 1, further comprising an urging member urges the handle in the direction along which the grip portion is separated from the panel portion.

3. The electronic module according to claim 2, further comprising:
    a holding unit that keeps the handle being in a state where the grip portion is close to the panel portion, against an urging force of the urging member.

4. An electronic device comprising:

the electronic module according to claim 3.

5. The electronic device according to claim 4, wherein the electronic module is disposed in a back side of the electronic device.

6. An electronic device comprising:

the electronic module according to claim 2.

7. The electronic device according to claim 6, wherein the electronic module is disposed in a back side of the electronic device.

8. The electronic module according to claim 1, wherein a terminal position, in which the rotating of the handle around the rotary pivots in the direction along which the grip portion is separated from the panel portion is terminated, is set so as to ensure a clearance between the grip portion and a portion to which the grip portion approaches by rotating the handle.

9. An electronic device comprising:

the electronic module according to claim 8.

10. The electronic device according to claim 9, wherein the electronic module is disposed in a back side of the electronic device.

11. An electronic device comprising:

the electronic module according to claim 1.

12. The electronic device according to claim 11, wherein the electronic module is disposed in a back side of the electronic device.

* * * * *